US 12,430,206 B2

United States Patent
Kientz et al.

(10) Patent No.: US 12,430,206 B2
(45) Date of Patent: Sep. 30, 2025

(54) TEMPERATURE SENSOR MANAGEMENT DURING ERROR HANDLING OPERATIONS IN A MEMORY SUB-SYSTEM

(71) Applicant: Micron Technology, Inc., Boise, ID (US)

(72) Inventors: Steven Michael Kientz, Westminster, CO (US); Hyungseok Kim, Santa Clara, CA (US); Zixiang Loh, San Jose, CA (US); Patrick R. Khayat, San Diego, CA (US); Jun Wan, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/661,526

(22) Filed: May 10, 2024

(65) Prior Publication Data

US 2024/0385926 A1    Nov. 21, 2024

Related U.S. Application Data

(60) Provisional application No. 63/503,255, filed on May 19, 2023.

(51) Int. Cl.
*G06F 11/10* (2006.01)
*G11C 7/04* (2006.01)
*G11C 29/52* (2006.01)

(52) U.S. Cl.
CPC ...... *G06F 11/1068* (2013.01); *G06F 11/1016* (2013.01); *G06F 11/1048* (2013.01); *G11C 7/04* (2013.01); *G11C 29/52* (2013.01)

(58) Field of Classification Search
CPC ............ G06F 11/1068; G06F 11/1016; G06F 11/1048; G11C 7/04; G11C 29/52
(Continued)

(56) References Cited

U.S. PATENT DOCUMENTS 10,078,546 B2 *   9/2018   Muchherla .............. G06F 11/30
10,579,468 B2 *   3/2020   Muchherla .............. G06F 11/30
(Continued)

FOREIGN PATENT DOCUMENTS

KR         101464256 B1      11/2014

OTHER PUBLICATIONS

International Search Report and Written Opinion for International Application No. PCT/US2024/030093 mailed Sep. 10, 2024, 08 pages.

*Primary Examiner* — John J Tabone, Jr.
(74) *Attorney, Agent, or Firm* — Lowenstein Sandler LLP (57) ABSTRACT

A system having a processing device operatively coupled with a memory device to perform the following operations: responsive to detecting a triggering event, measuring a temperature of the memory device to obtain a suspend temperature value, enabling a suspend temperature flag to indicate that temperature input for a step of an error handling operation is based on the suspend temperature value. Updating an operating temperature with the suspend temperature value. Determining, using a data structure which maps temperatures to read level offsets, a read level offset for the step of the error handling operation, based on the operating temperature. Causing the step of the error handling operation to be performed on a set of cells using a read level value based on the read level offset and a base read level, an disabling the suspend temperature flag.

20 Claims, 5 Drawing Sheets

(58) Field of Classification Search
USPC .............. 714/763, 773; 365/85.09, 211, 201
See application file for complete search history.

(56) References Cited

U.S. PATENT DOCUMENTS

| | | | | |
|---|---|---|---|---|
| 2009/0070651 | A1* | 3/2009 | Diggs | G06F 11/1068 |
| | | | | 714/752 |
| 2011/0276845 | A1* | 11/2011 | Depew | G11C 29/50 |
| | | | | 714/E11.159 |
| 2013/0111299 | A1* | 5/2013 | Hashimoto | G06F 11/1068 |
| | | | | 714/E11.032 |
| 2016/0117216 | A1* | 4/2016 | Muchherla | G06F 11/30 |
| | | | | 714/6.11 |
| 2017/0195848 | A1* | 7/2017 | Korneluk | H04W 4/029 |
| 2017/0200492 | A1* | 7/2017 | Yang | G11C 7/04 |
| 2017/0255403 | A1* | 9/2017 | Sharon | G06F 3/064 |
| 2018/0268891 | A1* | 9/2018 | Li | G11C 11/4074 |
| 2018/0293029 | A1* | 10/2018 | Achtenberg | G11C 29/028 |
| 2019/0012226 | A1* | 1/2019 | Muchherla | G06F 11/3058 |
| 2020/0019453 | A1* | 1/2020 | Chew | G06F 11/1008 |
| 2020/0133510 | A1* | 4/2020 | Koudele | G06F 3/0614 |
| 2020/0250061 | A1 | 8/2020 | Lee | |
| 2020/0257598 | A1* | 8/2020 | Yazovitsky | G11C 29/52 |
| 2021/0149564 | A1* | 5/2021 | Luo | G06F 3/0616 |
| 2021/0232342 | A1 | 7/2021 | Alsasua et al. | |
| 2021/0326208 | A1* | 10/2021 | Liang | G06F 11/0772 |
| 2022/0004456 | A1* | 1/2022 | Achtenberg | G11C 16/3404 |
| 2022/0068426 | A1* | 3/2022 | Muchherla | G06F 11/076 |
| 2023/0039381 | A1* | 2/2023 | Bueb | G11C 16/0483 |
| 2023/0170036 | A1* | 6/2023 | Duval | G11C 29/52 |
| 2024/0264746 | A1* | 8/2024 | Palmer | G06F 3/0653 |
| 2024/0385926 | A1* | 11/2024 | Kientz | G06F 11/1048 |

* cited by examiner

TEMPERATURE SENSOR MANAGEMENT DURING ERROR HANDLING OPERATIONS IN A MEMORY SUB-SYSTEM

RELATED APPLICATION

This application claims the benefit of U.S. Provisional Application No. 63/503,255 filed May 19, 2023, the entire contents of which are hereby incorporated by reference.

TECHNICAL FIELD

Embodiments of the disclosure relate generally to memory sub-systems, and more specifically, relate to temperature sensor management during error handling operations in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Aspects of the present disclosure are directed to temperature sensor management during error handling operations in a memory sub-system. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can utilize one or more memory devices, including any combination of the different types of non-volatile memory devices and/or volatile memory devices, to store the data provided by the host system. In some embodiments, a memory sub-system may be represented by a solid-state drive (SSD), which may include one or more non-volatile memory devices. In some embodiments, the non-volatile memory devices can be provided by not-and (NAND) type flash memory devices. Other examples of non-volatile memory devices are described below in conjunction with FIG. 1. A non-volatile memory device is a package of one or more dice. Each die can include one or more planes. A plane is a portion of a memory device that includes multiple memory cells. Some memory devices can include two or more planes. For some types of non-volatile memory devices (e.g., NAND devices), each plane includes a set of physical blocks. Each block includes a set of pages. "Block" herein shall refer to a set of contiguous or non-contiguous memory pages. A "block" can refer to a unit of the memory device used to store data and can include a group of memory cells. An example of a "block" is an "erasable block," which is the minimal erasable unit of memory, while "page" is a minimal writable unit of memory. Each page includes a set of memory cells. A memory cell is an electronic circuit that stores information.

A memory device can include multiple memory cells arranged in a two-dimensional or three-dimensional grid. The memory cells are formed onto a silicon wafer in an array of columns and rows. A memory cell includes a capacitor that holds an electric charge and a transistor that acts as a switch controlling access to the capacitor. Accordingly, the memory cell can be programmed (written to) by applying a certain voltage, which results in an electric charge being held by the capacitor. The memory cells are joined by wordlines, which are conducting lines electrically connected to the control gates of the memory cells, and bitlines, which are conducting lines electrically connected to the drain electrodes of the memory cells.

Depending on the cell type, each memory cell can store one or more bits of binary information and has various logic states that correlate to the number of bits being stored. The logic states can be represented by binary values, such as "0" and "1," or combinations of such values. A memory cell can be programmed (written to) by applying a certain voltage to the memory cell, which results in an electric charge being held by the memory cell, thus allowing modulation of the voltage distributions produced by the memory cell. A set of memory cells referred to as a memory page can be programmed together in a single operation, e.g., by selecting consecutive bitlines.

Precisely controlling the amount of the electric charge stored by the memory cell allows establishing multiple logical levels, thus effectively allowing a single memory cell to store multiple bits of information. A read operation can be performed by comparing the measured threshold voltages (Vt) exhibited by the memory cell to one or more reference voltage levels in order to distinguish between two logical levels for single-level cell (SLCs) and between multiple logical levels for multi-level cells.

Memory N access operations (e.g., a programming (write) operation, an erase operation, etc.) can be executed with respect to sets of the memory cells, e.g., in response to receiving memory access commands from the host. A memory access operation can specify the requested memory access operation (e.g., write, erase, read, etc.) and a logical address, which the memory sub-system would translate to a physical address identifying a set of memory cells (e.g., a block). A memory access operation (e.g., a request to read from a logical address) can include metadata associated with the data at the logical address. Metadata can include error-handling data (e.g., error correction code (ECC) codeword parity data), data version (e.g., used to distinguish age of data written), valid bitmap (which logical addresses contain valid data), etc.

Memory access operations can be susceptible to variations in temperature. A memory access operation performed at one temperature can have different parameter values than the same memory access operation performed at another temperature. For example, this can be observed in the phenomena known as cross temperature. "Cross temperature" can refer to the change in temperature between the time when data is written to a set of memory cells and when the data is read from the set of memory cells, and cross temperature conditions can cause errors in the memory sub-system. Cross temperature conditions can occur when the set of memory cells are programmed at a hot temperature (e.g., above a threshold value) and then read at a cold temperature (e.g., below the threshold value) or when the set of memory cells are programmed at a cold temperature and then read at a hot temperature. While cross temperature conditions as described here specifically refer to differences between a temperature during a programming operation and a temperature during a read operation, a change in temperature between connected memory access operations (e.g., such as memory operations performed as a memory process) can similarly cause errors in the memory sub-system. A change in temperature from the time a memory access operation starts to the time the memory access operation ends can cause an error in the memory sub-system.

In some implementations, a memory access operation or memory process can be interrupted by another request with a higher priority, such as a host request. Such an interruption can cause the memory access operation or memory process to be paused for an indefinite amount of time (i.e., the paused duration could be short or long). While the memory access operation or memory process is paused, the temperature of the memory sub-system has time change. The temperature variations while the memory access operation or memory process is paused can be greater than a temperature variation that might occur while the memory access operation or memory process that is not paused is performed. In some implementations, larger temperature variations can cause more and/or larger errors in the memory sub-system.

One type of error can be a read error. A "read error" refers to a memory sub-system's failure to validate one or more data items that have been retrieved from a memory device in response to a read command. Read errors can be associated with host-initiated read operations or system-initiated scanning operations and can occur due to, for example, the measured threshold voltage VT exhibited by the memory cell mismatching the read voltage levels, the requested data being subjected to noise or interference, etc. In a read error, the number of bit errors in the read data is greater than what the underlying error correction code (ECC) can correct, and this results in an ECC failure. In response to a read error, the memory sub-system can perform an error-handling flow in an attempt to recover the data. The error-handling flow (e.g., a memory process) can include one or more error-handling operations (e.g., memory access operations) performed with respect to the data items that have been retrieved from the memory device. An error handling operation, for example, can include one or more read retries using different parameters, such as a change in read voltage, as compared to the initial read operation performed on the memory cell. The error-handling operation can also include "deep error handling techniques," such as forward error correction (FEC) with various versions of reliability information, hybrid automatic repeat request (HARQ), etc.

A temperature compensation value is an offset which can be applied to a read voltage to compensate for the voltage shift due to temperature variation, including the cross temperature, or similar temperature variations described above. Depending on manufacturing variations in memory cells and memory devices, memory cells on a particular die may exhibit relatively similar behavior with respect to voltage shifts in response to changes in temperature. Accordingly, each die in the memory device may have a separate temperature compensation value rather than using a single temperature compensation value for the entire memory device. In some implementations, a temperature compensation value for some other level of granularity can be used, such as per cell, per block, per package, or per device compensation value.

Due to the temperature variations such as temperature sensing noise (e.g., small temperature fluctuations caused by the temperature sensors) or ambient temperature fluctuations (e.g., on one or more dies), multiple temperature compensation values can be affected even if the temperature has not changed much, for example, being within one to several degree Celsius. Changes in the temperature compensation values can cause read threshold voltage shifts and lead to raw bit error rate (RBER) spikes that are associated with threshold voltage shifts. The affected temperature compensation values can cause read threshold voltage shifts between memory access operations, especially, during an error handling flow, where early operations in the error-handling flow can optimize the read threshold voltages and use the read threshold voltages in later operations in the error-handling flow for more complex error handling.

Aspects of the present disclosure address the above and other deficiencies by providing a memory sub-system that suspends the temperature inputs for a memory sub-system during an error handling flow. In response to a triggering event, the memory sub-system controller can measure the temperature of the memory device, and enable a suspend temperature flag. The suspend temperature flag can indicate that real-time temperature inputs for one or more steps of the error handling flow will be suspended, and will instead be fixed to a certain temperature. In some implementations, the certain temperature can be the measured temperature. Upon completing the one or more steps of the error handling flow using the fixed certain temperature, the memory sub-system controller can disable the suspend temperature flag and return to using real-time temperature inputs for memory access operations or processes.

In some implementations where the error handling flow is paused, the memory sub-system controller can save the fixed certain temperature. After pausing the error handling flow, the memory sub-system controller can disable the suspend temperature flag and perform the respective interrupting operation(s). Upon completing the interrupting operation(s), the memory sub-system controller can enable the suspend temperature flag, retrieve the saved fixed certain temperature, and resume performing the error handling flow using the fixed certain temperature for temperature input. In this way, sequentially performed memory access operations which build on each other (such as in an error handling flow) can be performed under similar conditions.

Advantages of the present disclosure include, but are not limited to, performing related memory access operations or processes under similar conditions (e.g., using the same read level) despite variations in temperature and/or temporal gaps between starting and finishing the memory access operation or process.

Figure 1:
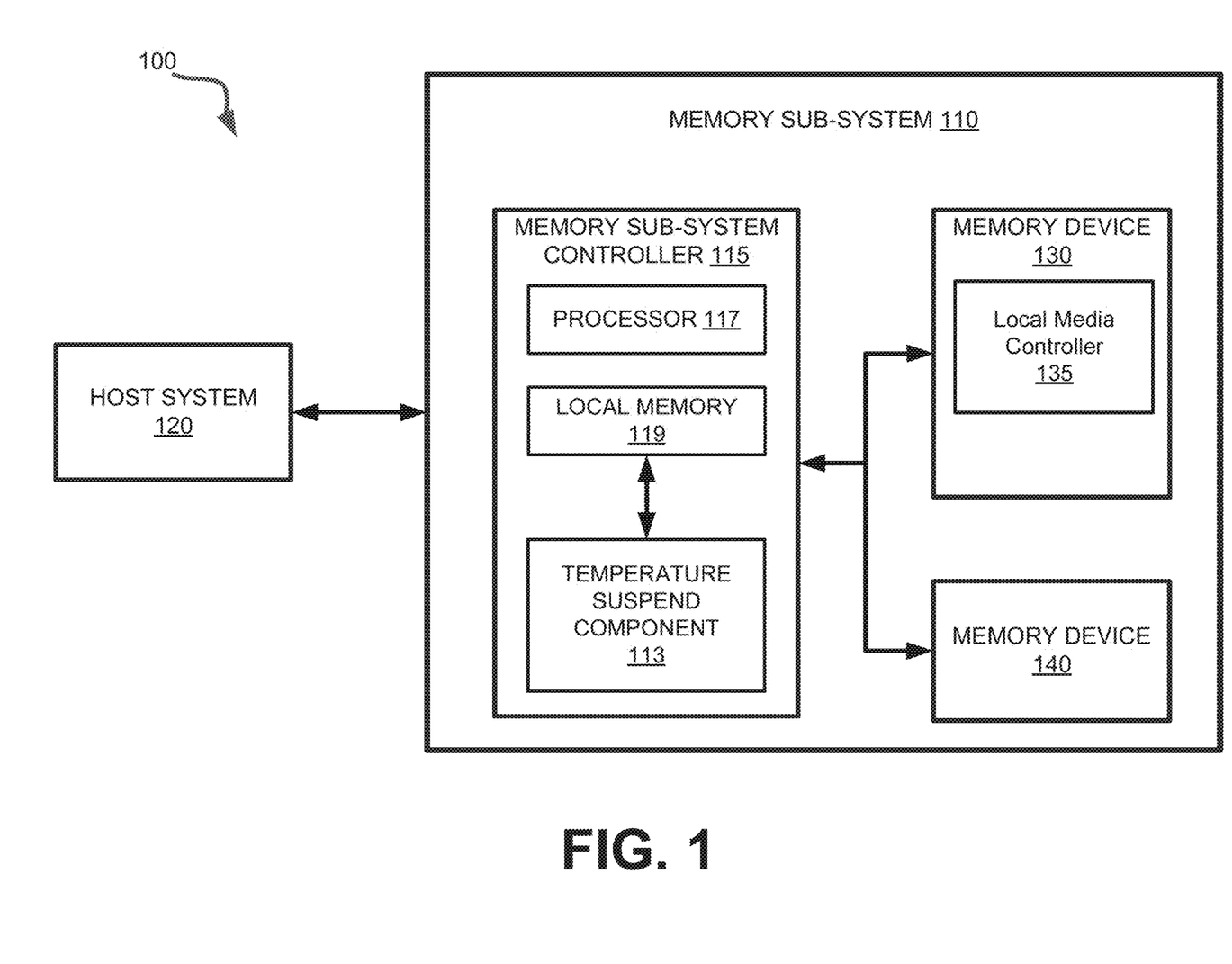
FIG. 1 illustrates an example computing system that includes a memory sub-system in accordance with some embodiments of the present disclosure.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a not-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), not-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system 110 includes a temperature suspend component 113 that can suspend the temperature input to the memory sub-system 110. In some embodiments, the memory sub-system controller 115 includes at least a portion of the temperature suspend component 113. In some embodiments, the temperature suspend component 113 is part of the host system 120, an application, or an operating system. In other embodiments, local media controller 135 includes at least a portion of temperature suspend component 113 and is configured to perform the functionality described herein.

The temperature suspend component 113 can include a temperature sensing component for the memory sub-system. In some embodiments, the temperature suspend component 113 can interface with a temperature sensing component (not pictured). Temperature suspend component 113 can cause the suspend temperature flag to be enabled/disabled. In some embodiments, temperature suspend component 113 can include the suspend temperature flag. Temperature suspend component 113 can provide a suspended temperature (e.g., a certain fixed temperature) to memory sub-system controller 115 to be used when calculating parameters of memory access operations, such as read levels, read level offsets, etc.

Temperature suspend component 113 can include one or more data structures, such as a data structure to store the suspend temperature flag, a data structure to store the certain fixed temperature, a data structure to map a given temperature to a read level or read level offset, etc. In some embodiments, temperature suspend component 113 can interface with local memory 119 and data structures can be a part of local memory 119. In some embodiments, temperature suspend component 113 can cause an error handling flow, or an error handling step within the error handling flow, to be paused and later resumed. Further details with regards to the operations of the temperature suspend component 113 are described below.

Figure 2A:
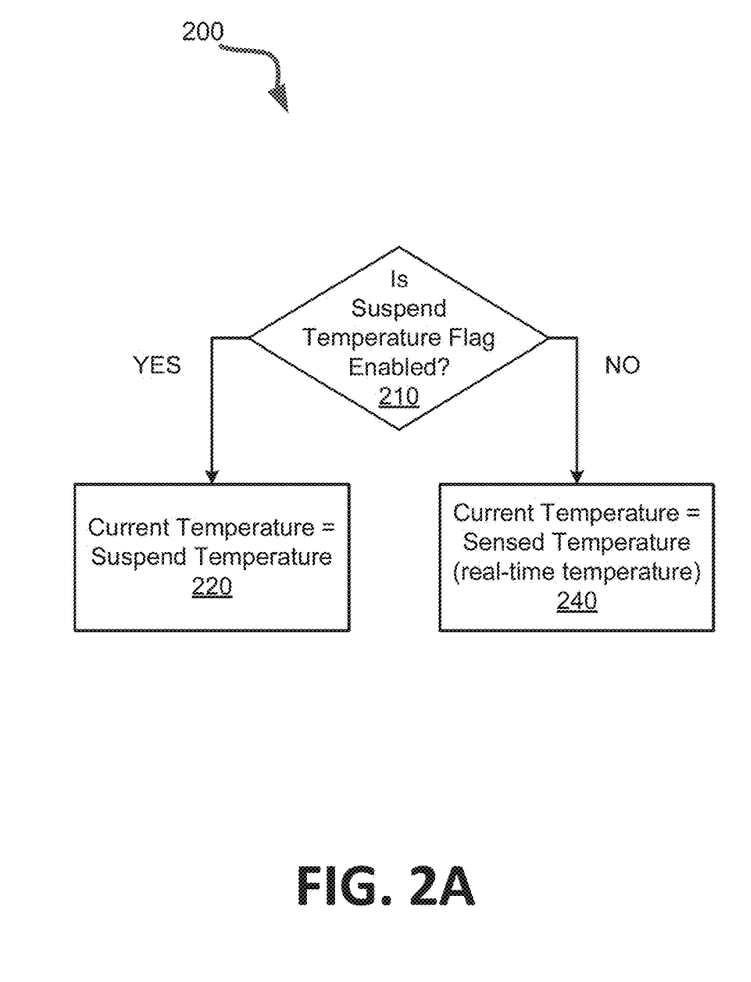
FIG. 2A is a flow diagram of an example method to suspend the temperature input value for a memory access operation, in accordance with some embodiments of the present disclosure.

FIG. 2A is a flow diagram of an example method 200 to suspend the temperature input value for a memory access operation, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the temperature suspend component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 210, the controller performing the method 200 determines whether the suspend temperature flag is enabled. The temperature suspend flag can a binary (on/off) value which is managed by the controller. In some embodiments, a temperature suspend component, (e.g., temperature suspend component 113 as described with respect to FIG. 1) can manage the value of the temperature suspend flag. The value of the temperature suspend flag can be stored in the memory sub-system. In some embodiments, the value of the temperature suspend flag can be stored in a local memory of the controller, such as local memory 119 as described with respect to FIG. 1.

The temperature suspend flag can be enabled when an error handling operation or a step of an error handling operation is temperature sensitive. Based on the value of the temperature suspend flag (i.e., whether the temperature suspend flag is enabled or disabled), the controller can determine to use a sensed temperature or a suspended temperature. A sensed temperature can refer to a current (i.e., real-time) measured temperature. The sensed temperature can be determined by a temperature component for the memory sub-system. In some embodiments, the temperature component can include one or more temperature probes across the memory sub-system. The sensed temperature can refer to a temperature input from one of the one or more temperature probes that corresponds to the set of cells on which the error handling operation is being performed (e.g., the temperature probe that is physically closest to the set of cells).

A suspended temperature can refer to a temperature selected by the controller for performing a given error handling step or operation. In some embodiments, the suspended temperature can be a sensed temperature at the time, or just before the given error handling step or operation begins. The suspend temperature can be stored in local memory of the controller, such as local memory 119. In some embodiments, the suspended temperature can be pre-selected for the given error handling step or operation based on a sensed temperature and/or additional memory device characteristics such as memory cell type, per cell memory density, etc. The suspend temperature can correspond to a given error handling step or operation. In some embodiments, different steps within an error handling operation can have different respective suspended temperatures. In some embodiments, related error handling operations can have different respective suspended temperatures.

At operation 220, if the suspend temperature flag is enabled (i.e., YES from operation 210), the controller sets the current temperature value equal to the value of the suspend temperature. The controller can identify the suspended temperature value from local memory. In some embodiments, upon initiating an error handling step or operation, the controller can identify a sensed temperature and use the sensed temperature as the suspended temperature for the respective error handling step or operation. In some embodiments, the controller can identify the suspended temperature value from a data structure which associates suspended temperature values with a given set of cells.

The controller can use the current temperature value to determine memory access operation parameters, such as read levels, read offsets, etc. The current temperature value can be suspended from being updated (i.e., new sensed temperatures from a temperature sensing component will not affect the current temperature value) for the duration that the suspend temperature flag is enabled. In some embodiments, the controller can cause newly sensed temperature values (e.g., real-time sensed temperature values from a temperature sensing component) to be saved and/or processed. In some embodiments, the controller can halt the real-time sensing of temperature values (e.g., the controller can cause a temperature sensing component to stop collecting real-time temperature readings).

At operation 240, if the suspend temperature flag is disabled (i.e., NO from operation 210), the controller sets the current temperature equal to the value of the sensed temperature. When the suspend temperature flag is disabled, the suspend temperature value can be reset. In some embodiments where the suspend temperature value is stored in a data structure that associates suspended temperatures with a given set of cells, the suspended temperature values in the data structure can be retained at least until the error handling step or operation have been completed.

Figure 2B:
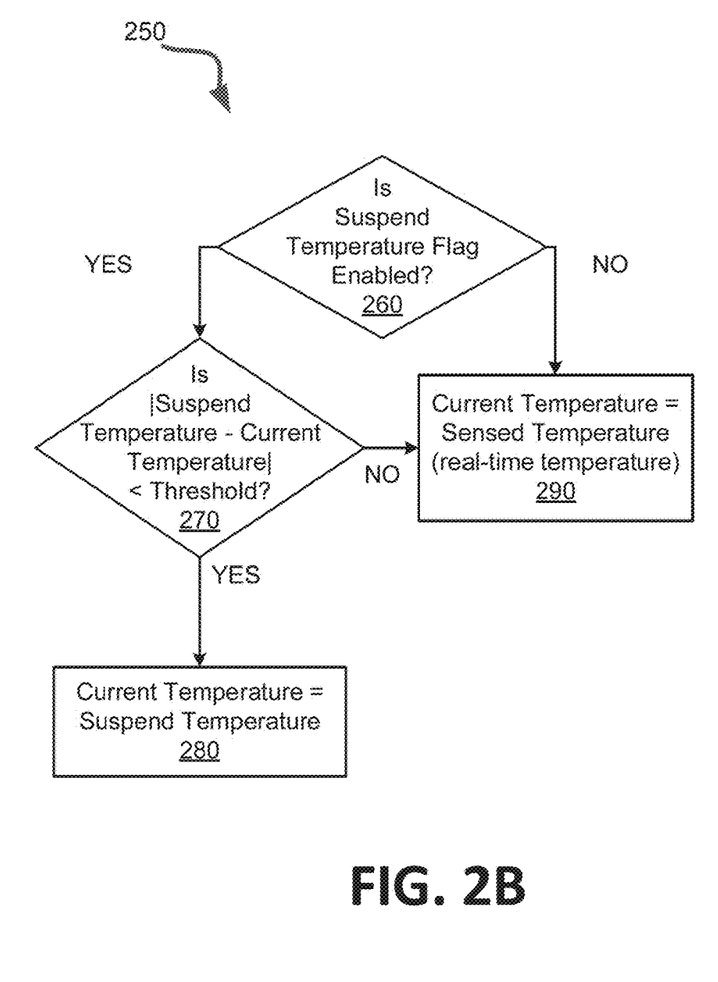
FIG. 2B is a flow diagram of an example method to suspend the temperature input value for a memory access operation, in accordance with some embodiments of the present disclosure.

FIG. 2B is a flow diagram of an example method 250 to suspend the temperature input value for a memory access operation, in accordance with some embodiments of the present disclosure. The method 250 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 250 is performed by the temperature suspend component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 260, the controller performing the method 250 determines whether the suspend temperature flag is enabled. The temperature suspend flag can a binary (on/off) value which is managed by the controller. In some embodiments, a temperature suspend component, (e.g., temperature suspend component 113 as described with respect to FIG. 1) can manage the value of the temperature suspend flag. The value of the temperature suspend flag can be stored in the memory sub-system. In some embodiments, the value of the temperature suspend flag can be stored in a local memory of the controller, such as local memory 119 as described with respect to FIG. 1.

The temperature suspend flag can be enabled when an error handling operation or a step of an error handling operation is temperature sensitive. Based on the value of the temperature suspend flag (i.e., whether the temperature suspend flag is enabled or disabled), the controller can determine to use a sensed temperature or a suspended temperature. A sensed temperature can refer to a current (i.e., real-time) measured temperature. The sensed temperature can be determined by a temperature component for the memory sub-system. In some embodiments, the temperature component can include one or more temperature probes across the memory sub-system. The sensed temperature can refer to a temperature input from one of the one or more temperature probes that corresponds to the set of cells on which the error handling operation is being performed (e.g., the temperature probe that is physically closest to the set of cells).

A suspended temperature can refer to a temperature selected by the controller for performing a given error handling step or operation. In some embodiments, the suspended temperature can be a sensed temperature at the time, or just before the given error handling step or operation begins. The suspend temperature can be stored in local memory of the controller, such as local memory 119. In some embodiments, the suspended temperature can be pre-selected for the given error handling step or operation based on a sensed temperature and/or additional memory device characteristics such as memory cell type, per cell memory density, etc. The suspend temperature can correspond to a given error handling step or operation. In some embodiments, different steps within an error handling operation can have different respective suspended temperatures. In some embodiments, related error handling operations can have different respective suspended temperatures.

At operation 270, if the suspend temperature flag is enabled (i.e., YES from operation 210), the controller determines whether the magnitude (e.g., the absolute value) of the difference between the suspend temperature and the current temperature is less than or equal to a threshold criterion. When the temperature difference meets or exceeds the threshold criterion, using the suspended temperature to determine parameters for error handling steps or operations can cause more errors in the memory sub-system than if the sensed temperature was used. If the temperature difference is less than or equal to the threshold criterion, the controller can use the suspend temperature for determining parameters of error handling steps or operations by proceeding to operation 280. If the temperature difference is greater than the threshold criterion, the controller can use the sensed temperature (e.g., real-time temperature). The threshold criterion can be a value stored in the memory sub-system. In some embodiments, the value of the threshold criterion can be pre-determined during production of the memory sub-system.

At operation 280 if the magnitude of the difference between the suspend temperature and the current temperature is less than the threshold criterion (i.e., YES from operation 270), the controller sets the current temperature value equal to the value of the suspend temperature. The controller can identify the suspended temperature value from local memory. In some embodiments, upon initiating an error handling step or operation, the controller can identify a sensed temperature and use the sensed temperature as the suspended temperature for the respective error handling step or operation. In some embodiments, the controller can identify the suspended temperature value from a data structure which associates suspended temperature values with a given set of cells.

The controller can use the current temperature value to determine memory access operation parameters, such as read levels, read offsets, etc. The current temperature value can be suspended from being updated (i.e., new sensed temperatures from a temperature sensing component will not affect the current temperature value) for the duration that the suspend temperature flag is enabled. In some embodiments, the controller can cause newly sensed temperature values (e.g., real-time sensed temperature values from a temperature sensing component) to be saved and/or processed. In some embodiments, the controller can halt the real-time sensing of temperature values (e.g., the controller can cause a temperature sensing component to stop collecting real-time temperature readings).

At operation 290, if the suspend temperature flag is disabled (i.e., NO from operation 210), or if the magnitude of the difference between the suspend temperature and the current temperature is greater than the threshold criterion (i.e., NO from operation 270), the controller sets the current temperature equal to the value of the sensed temperature. When the suspend temperature flag is disabled, the suspend temperature value can be reset. In some embodiments where the suspend temperature value is stored in a data structure that associates suspended temperatures with a given set of cells, the suspended temperature values in the data structure can be retained at least until the error handling step or operation have been completed.

Figure 3:
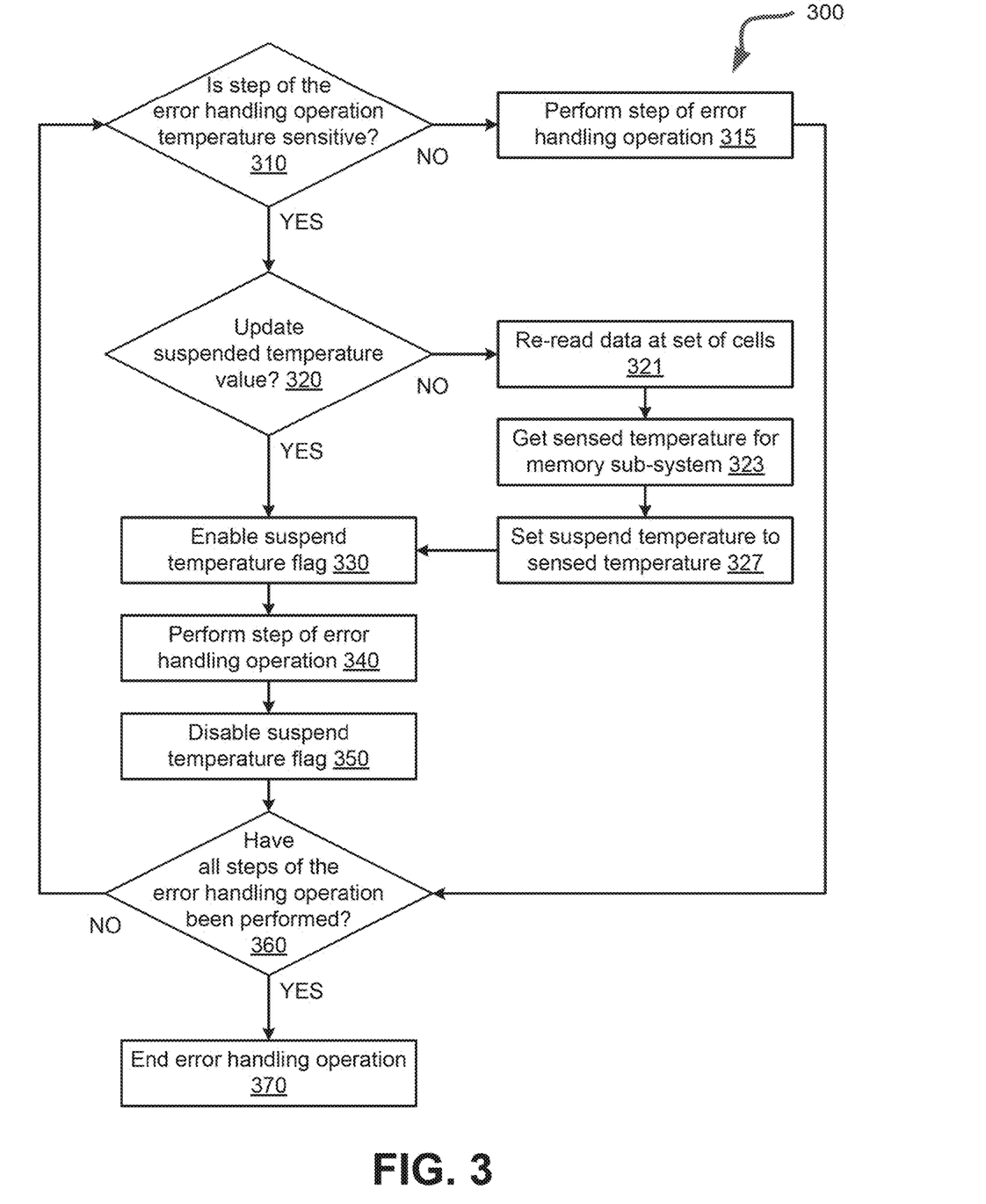
FIG. 3 is a flow diagram of an example method to suspend the temperature input value for a memory access operation, in accordance with some embodiments of the present disclosure.

FIG. 3 is a flow diagram of an example method 300 to suspend the temperature input value for a memory access operation, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the temperature suspend component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, the controller performing the method 300 determines whether a step of an error handling operation for a set of cells is temperature sensitive. Error handling steps (and error handling operations with multiple error handling steps) can be used to attempt to correct errors experienced by the memory sub-system. Parameters for performing error handling steps or operations can at least in part depend on the temperature at the time the error handling step or operation is performed. A temperature change during an error handling step or operation, or between a series of related error handling steps or operations can reduce the effectiveness of the error handling operation(s) to correct the error experienced by the memory sub-system. A change in temperature can reduce the likelihood that the error handling step or operation will successfully correct the error experienced by the memory sub-system. In some embodiments, steps of an error handling operation can build on previous steps, and performing a step at one temperature followed by another step at another temperature can reduce the effectiveness of the error handling operation(s). In some embodiments, an error handling operation can be performed using output from a previous error handling operation as an input. When the temperature is different during each error handling operation, the likelihood of correcting the error experienced by the memory sub-system can be reduced.

At operation 315, if the step of the error handling operation is not temperature sensitive (i.e., NO from operation 310), the controller performs the step of the error handling operation. The controller can save on compute time and resources by only using a suspended temperature(s) for temperature sensitive error handling steps or operations. In some embodiments, the controller can skip operation 310 when it is determined that performing the operation 310 adds unnecessary complexity. For example, if all, or a majority of the steps of an error handling operation are temperature sensitive, the controller can perform all error handling steps of the error handling operation with a suspended temperature. In another example, if only one of many steps of the error handling operation is temperature sensitive, but provides critical information, or is particularly temperature sensitive, the controller can perform all error handling steps of the error handling operation with a suspended temperature.

In some embodiments, different error handling steps or related operations can have different corresponding suspended temperatures. Because at least some error handling steps are performed sequentially, there is time for the temperature to change from when an error handling step is performed at the beginning of the error handling operation to when another error handling step is performed at the end of the error handling operation. In some embodiments, even though the temperature change might be minimal, performing each error handling step at respective temperatures can reduce the likelihood that the error handling operation will be performed incorrectly.

At operation 320, if the step of the error handling operation is temperature sensitive (i.e., YES from operation 310), the controller determines whether to update the suspended temperature value. When an error handling step is initiated, the suspend temperature value can be zero or uninitiated. The controller can determine that the suspended temperature value should be updated based on the value of the suspended temperature value, the amount of time since the suspended temperature value was updated, the error handling step which will use the suspended temperature value, and other memory sub-system characteristics.

At operation 321, if the suspended temperature value should be updated, (i.e., YES from operation 320), the controller re-reads data at the set of cells. Metadata about the set of cells can be returned alongside the data read from the set of cells. The metadata can indicate to the controller various characteristics of the set of cells, including read levels of the cells, voltage distributions etc.

At operation 323, the controller gets a sensed temperature value for the memory sub-system. The sensed temperature can be a real-time temperature of the memory sub-system. In some embodiments, the sensed temperature can be a real-time temperature sensed by one of many temperature probes of the memory sub-system. In some embodiments, temperature sensing by the temperature sensing component of the memory sub-system can be initiated by performing a read operation (i.e., the read operation of operation 321) on memory cells of the memory sub-system.

In some embodiments, the controller can save the value of the sensed temperature in a data structure as a suspended temperature value. In some embodiments, the suspended temperature value in the data structure can correspond to the error handling operation being performed. In some embodiments, the suspended temperature value in the data structure can correspond to the respective step of the error handling operation.

At operation 327, the controller sets the suspended temperature value to the sensed temperature value of operation 323. In some embodiments, the controller can set the suspended temperature value to a pre-determined temperature value in place of a real-timed sensed temperature.

At operation 330, if the suspended temperature value should not be updated (i.e., NO from operation 320), or if operation 327 has been performed, the controller enables the suspend temperature flag. With the suspend temperature flag enabled, the controller can identify and use the suspended temperature for the error handling step or operation. In some embodiments, the suspend temperature flag can be enabled for the duration of the error handling operation. In such embodiments, operation 330 can be performed at the beginning of the error handling operation, instead of before each step of the error handling operation.

At operation 340, the controller performs, or causes to be performed, the step of the error handling operation. In some embodiments, the step of the error handling operation can be interrupted by a request with a higher priority (e.g., a host request). In response to such a request, the controller can pause the error handling operation midway through the respective error handling step. In some embodiments, controller can finish the error handling step and then pause the error handling operation. After performing the interrupting request, the controller can resume the error handling operation.

At operation 350, the controller disables the suspend temperature flag. In some embodiments where the error handling step or operation has been paused for the controller to perform an interrupting request, the controller can perform operation 350 and disable the suspend temperature flag before performing the interrupting request. The interrupting request can be performed at the sensed (i.e., real-time) temperature value. After performing the interrupting request, the controller can perform operation 330 to enable the suspended temperature flag. The controller can then resume the error handling operation based on the suspended temperature value.

At operation 360, the controller determines whether all steps of the error handling operation have been performed. If the controller determines that there are additional steps to be performed in the error handling operation, the controller returns to operation 310.

At operation 370, if all steps of the error handling operation have been performed (i.e., YES from operation 360), the controller ends the error handling operation.

In some embodiments, all steps of the error handling operation can be temperature sensitive (e.g., the error handling operation can be temperature sensitive). The controller can perform suspended temperature value updates as needed (e.g., using operations 320, 321, 323, and 327 as needed), and then enable the suspend temperature flag by performing the operation 330. With the suspend temperature flag enabled, the controller can perform all steps of the error handling operation (i.e., the controller can perform the error handling operation) in like manner to performing the operation 340. After performing the error handling operation, the controller can disable the suspend temperature flag (e.g., with operation 340), and end the error handling operation (e.g., as in operation 370).

Figure 4:
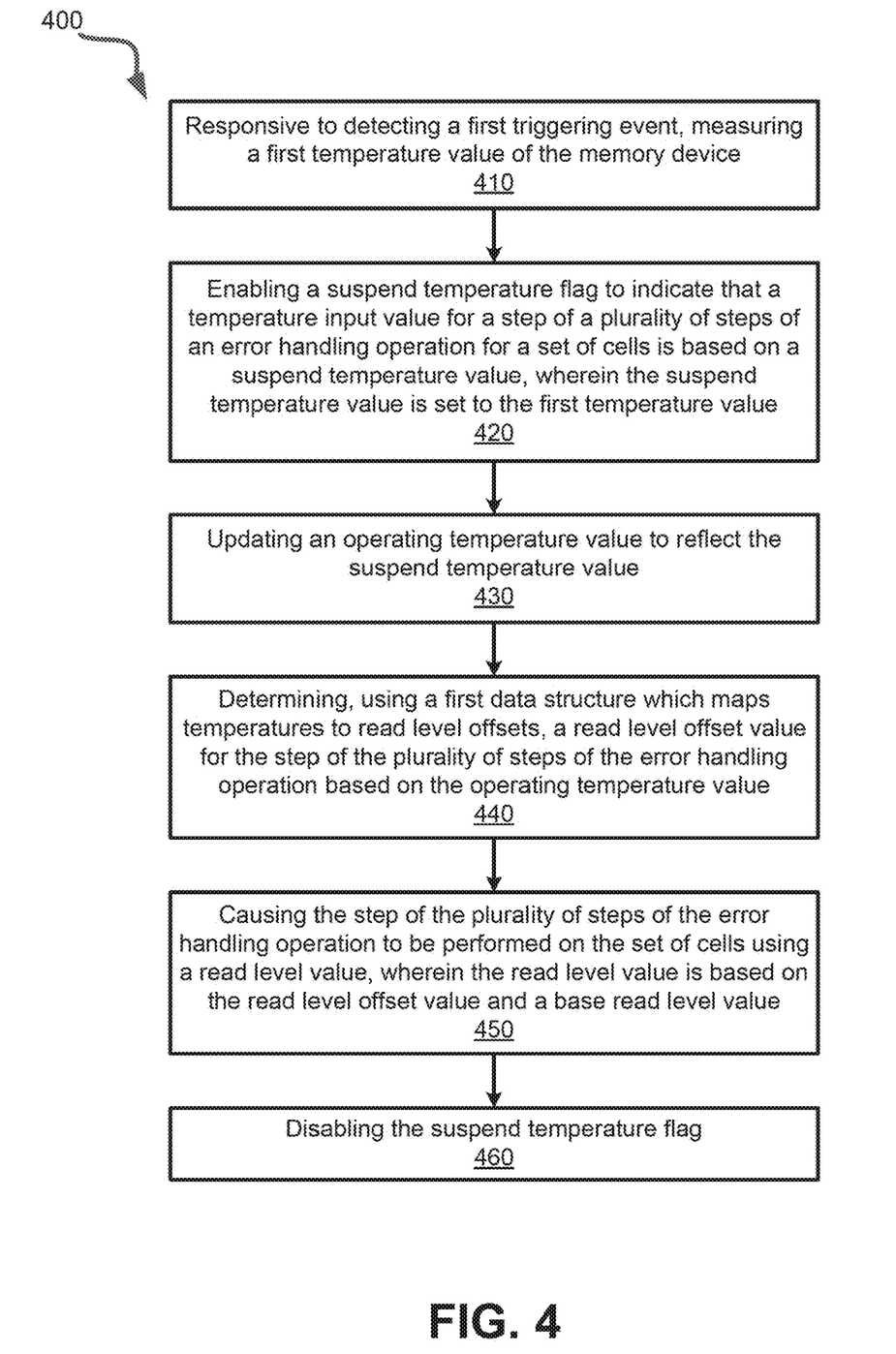
FIG. 4 is a flow diagram of an example method to suspend the temperature input value for a memory access operation, in accordance with some embodiments of the present disclosure.

FIG. 4 is a flow diagram of an example method 400 to suspend the temperature input value for a memory access operation, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the temperature suspend component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, responsive to detecting a first triggering event, the controller performing the method 400 measures a first temperature value of the memory device. In some embodiments, the first triggering event can be the initiation of an error handling operation. In some embodiments, the first triggering event can be other predefined events, such as a detection of an error in the memory sub-system or enabling the suspend temperature flag.

In some embodiments, the controller can store the first temperature value in a data structure. The data structure can map identifiers for sets of memory cells of the memory sub-system to corresponding suspended temperature values for a given step of an error handling operation. In some embodiments, the data structure can map identifiers for sets of memory cells to all steps of an error handling operation (i.e., the identifiers can map to an error handling operation). The data structure can be a part of local memory of the controller (e.g., such as local memory 119 as described with respect to FIG. 1), or of another part of the memory sub-system.

At operation 420, the controller enables a suspend temperature flag to indicate that a temperature input value for a step of a plurality of steps of an error handling operation for a set of cells is based on a suspend temperature value, wherein the suspend temperature value is set to the first temperature value. The suspend temperature can correspond to the temperature of the memory sub-system at the time that the error handling operation was initiated. In some embodiments, the suspend temperature can correspond to the temperature of the memory sub-system at the time that a given step of the error handling operation was initiated.

At operation 430, the controller updates an operating temperature value to reflect the suspend temperature value. The controller can use the operating temperature for performing various memory access operations, including error handling operations. When the suspend temperature flag is disabled, the operating temperature can reflect a real-time measured (i.e., sensed) temperature of the memory sub-system. When the temperature flag is enabled (as in operation 420), the operating temperature can be set to the value of the suspended temperature. The operating temperature can remain at the value of the suspended temperature until the suspend temperature flag is disabled. In some embodiments, the operating temperature can remain at the value of the suspended temperature for a time duration, a certain number of cycles, and/or a number of memory access operations.

At operation 440, the controller determines, using a first data structure which maps temperatures to read level offsets, a read level offset value for the step of the plurality of steps of the error handling operation based on the operating temperature value. The data structure can be stored in local memory of the controller (e.g., such as local memory 119 as described with respect to FIG. 1), or in another part of the memory sub-system. The mapping between temperatures and read level offsets can be predetermined during production of the memory sub-system. The read level offset value can be temperature dependent, where higher temperatures correspond to larger read level offsets and lower temperatures correspond to smaller read level offsets. In some embodiments, higher temperatures can correspond to smaller read level offsets and lower temperatures can correspond to larger read level offsets. As used herein, "larger" and "smaller" can refer to the magnitude of the read level offset, independent of an indication that the read level offset is a positive or negative value. In some embodiments, higher temperatures can correspond to a positive read level offset value and lower temperatures can correspond to a negative read level offset value. In some embodiments, higher temperatures can correspond to a negative read level offset value and lower temperatures can correspond to a positive read level offset value.

At operation 450, the controller causes the step of the plurality of steps of the error handling operation to be performed on the set of cells using a read level value, wherein the read level value is based on the read level offset value and a base read level value. In some embodiments, the data structure described with respect to operation 440 can account for base read levels and read level offsets, and can thus map temperatures directly to read levels. In some embodiments, the base read level value and the read level offset value can be summed based on each value's respective sign. In some embodiments, the controller can determine whether the magnitude (i.e., absolute value) of the base read level should be added to, or subtracted from by the magnitude of the read level offset value.

At operation 460, the controller disables the suspend temperature flag. The controller can continue performing steps of the error handling operation, or if all steps of the error handling operation have been completed, the controller can end the error handling operation. In some embodiments, the controller can disable the suspend temperature flag responsive to performing a certain step of the error handling operation (e.g., the last step). In some embodiments, the controller can disable the suspend temperature flag after an error handling operation is performed. For example, if all steps of the error handling operation will be performed using the suspended temperature value, the controller can enable the suspend temperature flag before starting the error handling operation, and disable the suspend temperature flag after finishing the error handling operation. Each step of an error handling operation can have a respective suspended temperature value. In some embodiments, disabling the suspended temperature flag does not affect the value of the operating temperature (i.e., the operating temperature will remain at the suspended temperature until another operation changes the operating temperature. In some embodiments, disabling the suspended temperature flag causes the operating temperature to be updated to a sensed (i.e., real-time) temperature of the memory sub-system.

In some embodiments, responsive to detecting a second triggering event, the controller can pause the error handling operation. In some embodiments, the second triggering event can be an interrupting memory access operation (e.g., a host request, etc.). In some embodiments, the error handling operation can be paused during a step of the error handling operation. Upon resuming the error handling operation, the step is completed. In some embodiments, the error handling operation can be paused after completing the step that was being performed when the request was received. Upon resuming the error handling operation, the next step after the most recently completed step can be initiated. The controller can disable the suspend temperature flag. The controller can measure a second temperature value of the memory device and update the operating temperature value to reflect the second temperature value. In some embodiments, a specific memory access operation or series of memory access operations can be associated with the second triggering event. The controller can perform these specified memory access operation(s) based on the operating temperature value (i.e., the second temperature value). In some embodiments, the controller can update the operating temperature to the previous suspend temperature before resuming the error handling operation. The controller can update a temporary temperature value to the suspend temperature value. In some embodiments, the temporary temperature value can be updated to a user-defined temperature or a pre-determined temperature that is different from the suspend temperature. Prior to resuming the error handling operation for the set of cells based on the operating temperature value, the controller can enable the suspend temperature flag. The controller can update the operating temperature value to reflect the temporary temperature value. The controller can resume the error handling operation for the set of cells based on the operating temperature value (i.e., the previously used suspended temperature value).

In some embodiments, the controller can measure a current (i.e., real-time) temperature value of the memory device. In some embodiments, when the temperature of the memory sub-system changes rapidly, using a suspended temperature can increase the quantity of errors in the error handling operation. By detecting a rapid change in the temperature of the memory sub-system (i.e., by using a temperature difference threshold), the controller can determine that using the real-time temperature value of the memory device is likely to produce less errors than if the suspended temperature value were used. Responsive to determining that the current temperature value exceeds a threshold temperature relative to the first temperature value, the controller can disable the suspend temperature flag. With the suspend temperature flag disabled, the controller can update the operating temperature value to the current temperature value. The controller can resume performing the error handling operation using the operating temperature (e.g., an updated real-time temperature after a previously rapid and/or large change in temperature).

Figure 5:
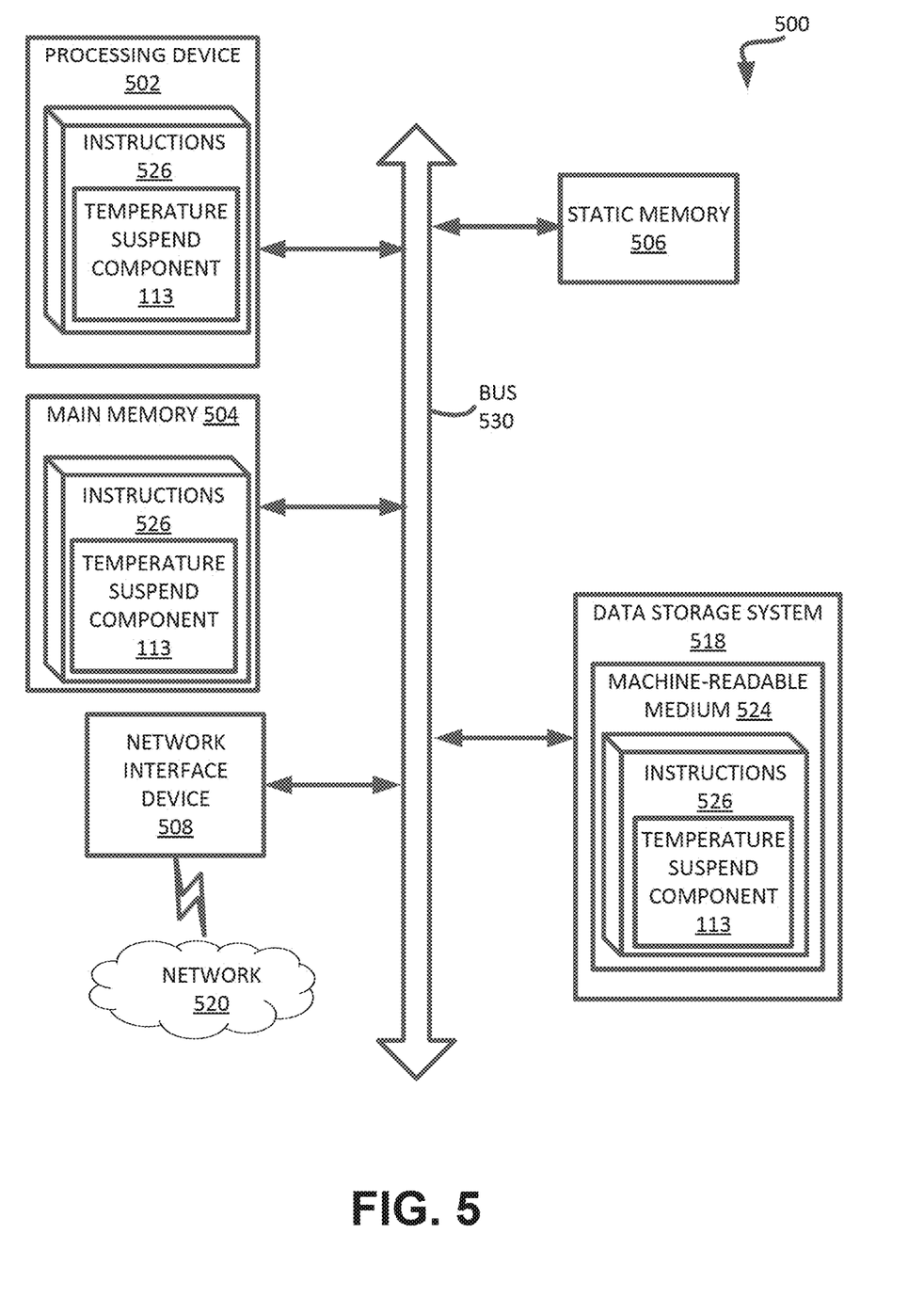
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the temperature suspend component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or RDRAM, etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a temperature suspend component (e.g., the temperature suspend component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device comprising a plurality of cells; and
a processing device, operatively coupled with the memory device, to perform operations comprising:
responsive to detecting a first triggering event, measuring a first temperature value of the memory device;
enabling a suspend temperature flag to indicate that a temperature input value for a step of a plurality of steps of an error handling operation for a set of cells of the plurality of cells is based on a suspend temperature value, wherein the suspend temperature value is set to the first temperature value;
updating an operating temperature value to reflect the suspend temperature value;
determining, using a first data structure which maps temperatures to read level offsets, a read level offset value for the step of the plurality of steps of the error handling operation based on the operating temperature value;
causing the step of the plurality of steps of the error handling operation to be performed on the set of cells using a read level value, wherein the read level value is based on the read level offset value and a base read level value; and
disabling the suspend temperature flag.

2. The system of claim 1 comprising:
responsive to detecting a second triggering event, pausing the error handling operation;
disabling the suspend temperature flag;
measuring a second temperature value of the memory device;
updating the operating temperature value to reflect the second temperature value of the memory device;
performing a memory access operation associated with the second triggering event based on the operating temperature value;
enabling the suspend temperature flag; and
resuming the error handling operation for the set of cells based on the operating temperature value.

3. The system of claim 2 comprising:
updating a temporary temperature value to the suspend temperature value;
prior to resuming the error handling operation for the set of cells based on the operating temperature value, enabling the suspend temperature flag; and
updating the operating temperature value to reflect the temporary temperature value.

4. The system of claim 2, wherein the error handling operation is paused during the step of the plurality of steps of the error handling operation, and wherein upon resuming the error handling operation, the step of the plurality of steps is completed.

5. The system of claim 2, wherein the error handling operation is paused after completing the step of the plurality of steps of the error handling operation, and wherein upon resuming the error handling operation, a next step of the plurality of steps is initiated.

6. The system of claim 2, wherein the second triggering event comprises an interrupting memory access operation.

7. The system of claim 1 comprising:
storing, in a second data structure which maps identifiers for sets of cells of the plurality of cells to corresponding temperature values for a given step of the plurality of steps of the error handling operation, the first temperature value of the memory device as a temperature value corresponding to the set of cells.

8. The system of claim 1 comprising:
measuring a current temperature value of the memory device;
responsive to determining that the current temperature value exceeds a threshold temperature relative to the first temperature value, disabling the suspend temperature flag; and
updating the operating temperature value to the current temperature value.

9. The system of claim 1, wherein the first triggering event comprises initiating the error handling operation.

10. A method comprising:
responsive to detecting a first triggering event, measuring, by a processing device, a first temperature value of a memory device;
enabling a suspend temperature flag to indicate that a temperature input value for a step of a plurality of steps of an error handling operation for a set of cells of a plurality of cells is based on a suspend temperature value, wherein the suspend temperature value is set to the first temperature value;

updating an operating temperature value to reflect the suspend temperature value;

determining, using a first data structure which maps temperatures to read level offsets, a read level offset value for the step of the plurality of steps of the error handling operation based on the operating temperature value;

causing the step of the plurality of steps of the error handling operation to be performed on the set of cells using a read level value, wherein the read level value is based on the read level offset value and a base read level value; and disabling the suspend temperature flag.

11. The method of claim 10 comprising:

responsive to detecting a second triggering event, pausing the error handling operation;

disabling the suspend temperature flag;

measuring a second temperature value of the memory device;

updating the operating temperature value to reflect the second temperature value of the memory device;

performing a memory access operation associated with the second triggering event based on the operating temperature value;

enabling the suspend temperature flag; and resuming the error handling operation for the set of cells based on the operating temperature value.

12. The method of claim 11 comprising:

updating a temporary temperature value to the suspend temperature value;

prior to resuming the error handling operation for the set of cells based on the operating temperature value, enabling the suspend temperature flag; and updating the operating temperature value to reflect the temporary temperature value.

13. The method of claim 11, wherein the error handling operation is paused during the step of the plurality of steps of the error handling operation, and wherein upon resuming the error handling operation, the step of the plurality of steps is completed.

14. The method of claim 11, wherein the error handling operation is paused after completing the step of the plurality of steps of the error handling operation, and wherein upon resuming the error handling operation, a next step of the plurality of steps is initiated.

15. The method of claim 11, wherein the second triggering event comprises an interrupting memory access operation.

16. The method of claim 10 comprising:

storing, in a second data structure which maps identifiers for sets of cells of the plurality of cells to corresponding temperature values for a given step of the plurality of steps of the error handling operation, the first temperature value of the memory device as a temperature value corresponding to the set of cells.

17. The method of claim 10 comprising:

measuring a current temperature value of the memory device;

responsive to determining that the current temperature value exceeds a threshold temperature relative to the first temperature value, disabling the suspend temperature flag; and updating the operating temperature value to the current temperature value.

18. The method of claim 10, wherein the first triggering event comprises initiating the error handling operation.

19. A computer-readable non-transitory storage medium comprising executable instructions that, when executed by a controller managing a memory device comprising a plurality of memory cells, cause the controller to:

responsive to detecting a first triggering event, measure a first temperature value of a memory device;

enable a suspend temperature flag to indicate that a temperature input value for a step of a plurality of steps of an error handling operation for a set of cells of a plurality of cells is based on a suspend temperature value, wherein the suspend temperature value is set to the first temperature value;

update an operating temperature value to reflect the suspend temperature value;

determine, using a first data structure which maps temperatures to read level offsets, a read level offset value for the step of the plurality of steps of the error handling operation based on the operating temperature value;

cause the step of the plurality of steps of the error handling operation to be performed on the set of cells using a read level value, wherein the read level value is based on the read level offset value and a base read level value; and disable the suspend temperature flag.

20. The computer-readable non-transitory storage medium of claim 19, comprising:

measuring a current temperature value of the memory device;

responsive to determining that the current temperature value exceeds a threshold temperature relative to the first temperature value, disabling the suspend temperature flag; and updating the operating temperature value to the current temperature value.

\* \* \* \* \*